US009066455B2

(12) United States Patent
Takaura

(10) Patent No.: US 9,066,455 B2
(45) Date of Patent: Jun. 23, 2015

(54) FLEXIBLE PRINTED WIRING BOARD HAVING CONNECTOR CONNECTING PORTION

(75) Inventor: Akira Takaura, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 182 days.

(21) Appl. No.: 13/479,844

(22) Filed: May 24, 2012

(65) Prior Publication Data

US 2012/0305294 A1   Dec. 6, 2012

(30) Foreign Application Priority Data

May 31, 2011  (JP) .................................. 2011-121527

(51) Int. Cl.
*H05K 1/00* (2006.01)
*H05K 3/24* (2006.01)
*H05K 1/11* (2006.01)
*H05K 1/02* (2006.01)

(52) U.S. Cl.
CPC ................ *H05K 3/242* (2013.01); *H05K 1/117* (2013.01); *H05K 1/0269* (2013.01); *H05K 1/118* (2013.01); *H05K 2203/166* (2013.01)
USPC ...... 174/254; 174/115; 174/117 FF; 174/261; 174/250

(58) Field of Classification Search
CPC ....... H05K 1/117; H05K 1/118; H01R 12/79; H01R 12/88; H01R 12/89; H01R 12/774; H01R 12/592; H01R 23/661
USPC ...... 174/254, 115, 117 FF, 138 R, 250, 26, 1; 439/494, 260, 329, 59, 660, 362, 60, 439/61, 62, 7, 9
See application file for complete search history.

(56) References Cited

U.S. PATENT DOCUMENTS

| 6,118,665 | A  | * | 9/2000 | Kishida et al. ................ 361/749 |
|---|---|---|---|---|
| 6,452,114 | B1 | * | 9/2002 | Schweitzer et al. .......... 174/261 |
| 2006/0035516 | A1 | * | 2/2006 | Wu et al. ........................ 439/492 |
| 2006/0160390 | A1 | * | 7/2006 | Miura et al. ................... 439/260 |
| 2010/0053139 | A1 | * | 3/2010 | Shinn et al. ................... 345/211 |
| 2010/0202119 | A1 | * | 8/2010 | Nagami et al. ................ 361/749 |
| 2012/0231646 | A1 | * | 9/2012 | Nakano ........................ 439/267 |

FOREIGN PATENT DOCUMENTS

| JP | 61-088674 | A | 6/1986 |
|---|---|---|---|
| JP | 61-088674 | U | 6/1986 |
| JP | 05-165048 | | 6/1993 |
| JP | 06-196869 | | 7/1994 |
| JP | 2001-085810 | A | 3/2001 |
| JP | 2006-310449 | A | 9/2006 |
| JP | 2008-091757 | A | 4/2008 |
| JP | 2009-267106 | A | 11/2009 |

OTHER PUBLICATIONS

Jan. 6, 2015 Japanese Office Action, issued in Japanese Patent Application No. 2011-121527.

* cited by examiner

*Primary Examiner* — Tuan T Dinh
*Assistant Examiner* — Steven T Sawyer
(74) *Attorney, Agent, or Firm* — Cowan, Liebowitz & Latman, P.C.

(57) ABSTRACT

A flexible printed wiring board capable of preventing plated leads from peeling off due to repeated insertion and extraction of a connector connecting portion into and from a connector without bringing about an increase in the whole length of the flexible printed wiring board even when the flexible printed wiring board is a one-sided or double-sided one. First plated leads are provided in a manner extending from conductor patterns located outermost in a width direction of the connector connecting portion among a plurality of conductor patterns and reaching sides of the flexible printed wiring board in a width direction. Second plated leads are provided in a manner extending from leading ends of the other conductor patterns among the plurality of conductor patterns in a direction in which the connector connecting portion is inserted into the connector and reaching a leading end face of the flexible printed wiring board.

6 Claims, 11 Drawing Sheets

FLEXIBLE PRINTED WIRING BOARD HAVING CONNECTOR CONNECTING PORTION

BACKGROUND OF THE INVENTION

1. Field of the Invention

The present invention relates to a flexible printed wiring board having a connector connecting portion.

2. Description of the Related Art

FIG. 11 shows an exemplary conventional flexible printed wiring board. This flexible printed wiring board 1 has a connector connecting portion 2 at a leading end thereof. A plurality of conductor patterns 3 are exposed in the connector connecting portion 2, and to ensure hardness and prevent oxidization, the exposed portion is subjected to multilayer electrolytic plating. Accordingly, plated leads 4 are provided in a manner extending from leading ends of the conductor patterns 3 to a leading end face of the flexible printed wiring board 1 in a direction in which the flexible printed wiring board 1 is inserted, so that the conductor patterns 3 and plating electrodes can be electrically connected to each other.

In many cases, the connector connecting portion 2 is inserted obliquely (obliquely in plan view) to a normal insertion direction into a connector 5 that is relatively small in width. In such cases, the plated leads 4 located outermost in the width direction of the connector connecting portion 2 slide in contact with the connector terminals in the connector 5 obliquely across the connector terminals.

Here, the plated leads 4 have low peel strength in a direction perpendicular to the direction in which they extend, and hence repeated insertion and extraction of the connector connecting portion 2 into and from the connector 5 may cause the plated leads 4 to peel off, resulting in electrically poor connection, leakage, shorting, or the like.

Accordingly, there has been proposed a technique according to which concaves are provided in leading end faces of plated leads of a flexible printed wiring board so as to inhibit the plated leads from coming into contact with connector terminals or the like (Japanese Laid-Open Patent Publication (Kokai) No. H05-165048). Also, there has been proposed a technique according to which in a multilayer printed wiring board, plated leads are disposed in an internal layer and sandwiched between upper and lower base material layers so as to inhibit the plated leads from coming into contact with connector terminals or the like (Japanese Laid-Open Patent Publication (Kokai) No. H06-196869).

However, if concaves are provided in leading end faces of plated leads of a flexible printed wiring board as with the technique described in Japanese Laid-Open Patent Publication (Kokai) No. H05-165048, the overall length of the flexible printed wiring board will increase correspondingly.

Also, the technique described in Japanese Laid-Open Patent Publication (Kokai) No. H06-196869 cannot be applied to a one-sided flexible printed wiring board or a double-sided flexible printed wiring board.

SUMMARY OF THE INVENTION

The present invention provides a flexible printed wiring board that is capable of preventing plated leads from peeling off due to repeated insertion and extraction of a connector connecting portion into and from a connector without bringing about an increase in the whole length of the flexible printed wiring board even when the flexible printed wiring board is a one-sided or double-sided one.

Accordingly, a first aspect of the present invention provides a flexible printed wiring board which has a connector connecting portion electrically connected to connector terminals of a connector, and in which in the connector connecting portion, a plurality of conductor patterns are spaced in a width direction of the connector connecting portion, comprising first plated leads provided in a manner extending from conductor patterns located outermost in the width direction of the connector connecting portion among the plurality of conductor patterns and reaching sides of the flexible printed wiring board in a width direction, and second plated leads provided in a manner extending from leading ends of the other conductor patterns among the plurality of conductor patterns in a direction in which the connector connecting portion is inserted into the connector and reaching a leading end face of the flexible printed wiring board.

According to the present invention, the plated leads can be prevented from peeling off due to repeated insertion and extraction of the connector connecting portion into and from the connector without bringing about an increase in the whole length of the flexible printed wiring board even when the flexible printed wiring board is a one-sided or double-sided one.

Further features of the present invention will become apparent from the following description of exemplary embodiments (with reference to the attached drawings).

DESCRIPTION OF THE EMBODIMENTS

The present invention will now be described in detail with reference to the drawings showing embodiments thereof.

Figure 1:
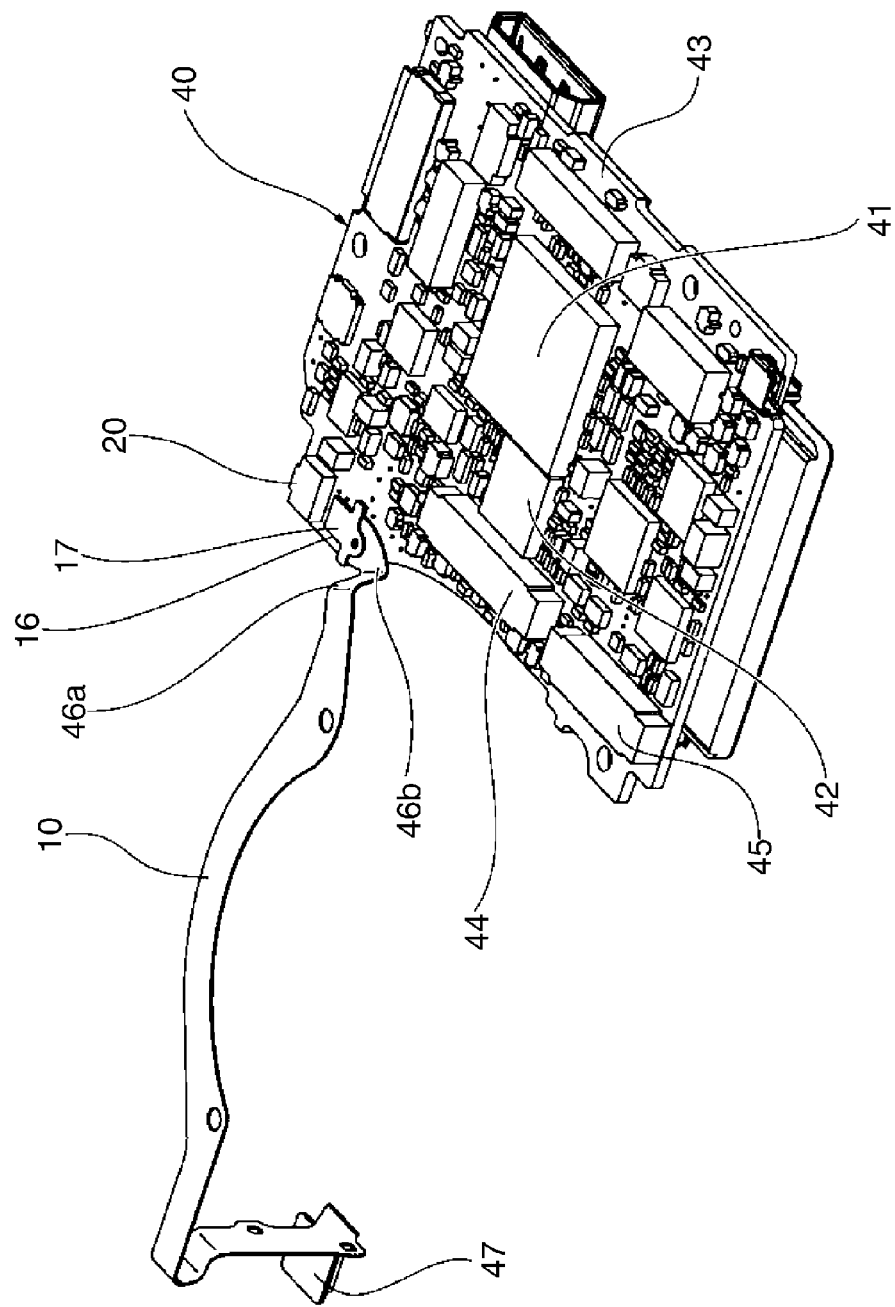
FIG. 1 is a perspective view showing a state before a connector connecting portion of a flexible printed wiring board according to a first embodiment of the present invention is connected to a connector of a main substrate unit in a digital camera.

FIG. 1 is a perspective view showing a state before a connector connecting portion 16 of a flexible printed wiring board 10 according to a first embodiment of the present invention is connected to a connector 20 of a main substrate unit 40 in a digital camera.

Referring to FIG. 1, the main substrate unit 40 is constructed such that a CPU 41, an image processing IC 42, and so on are mounted on a hard substrate 43. Also, the microphone connecting connector 20, an image pickup device connecting connector 44, and a lens barrel connecting connector 45 are provided on the hard substrate 43.

The connector connecting portion 16, which is to be electrically connected to the connector 20, is provided at one end of the flexible printed wiring board 10, and a microphone 47 is connected to the other end of the flexible printed wiring board 10. The connector connecting portion 16 is reinforced by a reinforcing sheet 17.

The flexible printed wiring board 10 also has two bent portions 46a and 46b in the vicinity of the connector connecting portion 16. The reason why these two bend portions 46a and 46b are required is that the connector connecting portion 16 must be connected to the connector 20 in a relatively narrow space. Moreover, in many cases, the connector connecting portion 16 is inserted into the relatively narrow connector 20 obliquely in plan view, and also, after the insertion, the connector connecting portion 16 tends to be rotated right or left so as to be aligned.

Figure 2:
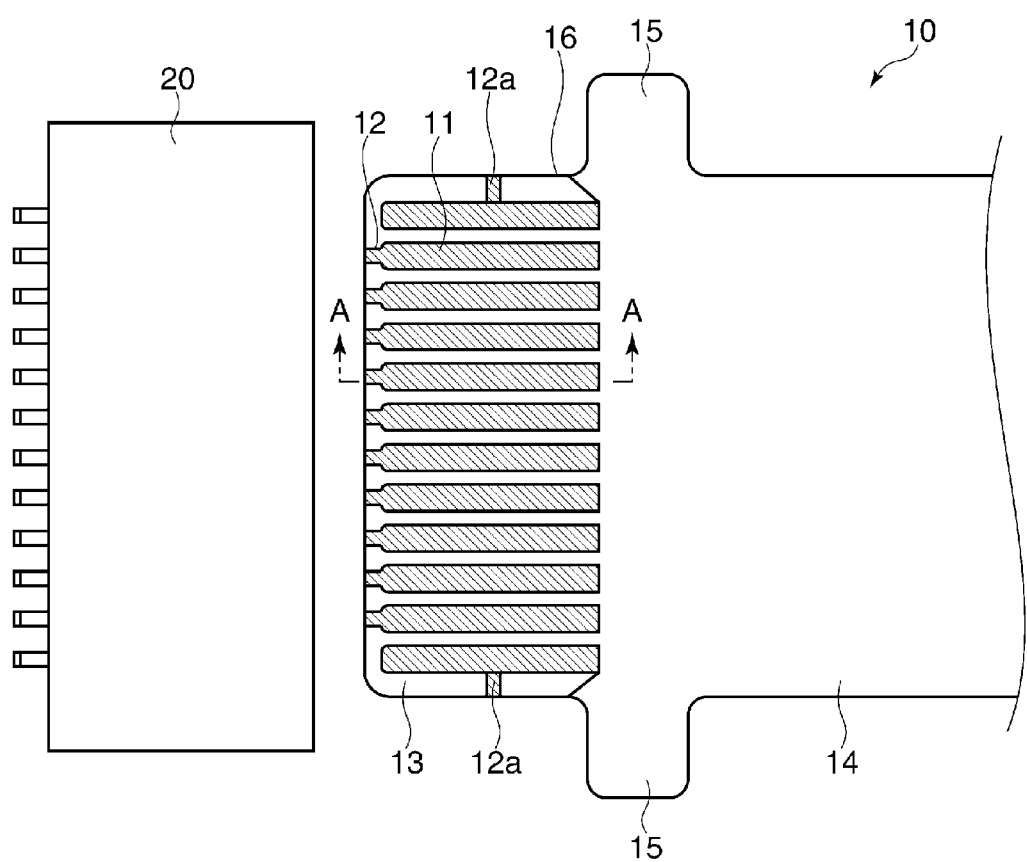
FIG. 2 is a plan view showing essential parts in a state before the connector connecting portion of the flexible printed wiring board is connected to the connector.
Figure 3:
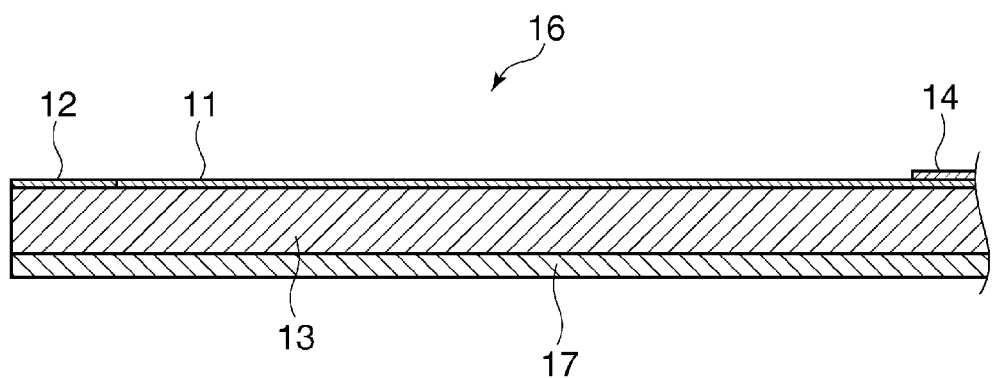
FIG. 3 is a cross-sectional view taken along line A-A of FIG. 2.

FIG. 2 is a plan view showing essential parts in a state before the connector connecting portion 16 is connected to the connector 20, and FIG. 3 is a cross-sectional view taken along line A-A of FIG. 2.

Referring to FIGS. 2 and 3, the flexible printed wiring board 10 is constructed such that a plurality of (twelve in the figure) conductor patterns 11 made of, for example, copper foil and extending from one end to the other end of a base film 13 are fixed on a surface of the base film 13 by an adhesive agent or the like at substantially equal intervals in the width direction of the base film 13.

Portions of the plurality of conductor patterns 11 on the base film 13 except the connector connecting portion 16 are protected by a coverlay layer 14 laminated thereon. Thus, in the connector connecting portion 16, the conductor patterns 11 are partially exposed on the base film 13.

Insertion-extraction flange portions 15 projecting externally in the width direction are provided on respective both sides of the coverlay layer 14 which are close to the connector connecting portion 16. The flange portions 15 as well are constructed such that the coverlay layer 14 is laminated on the base film 13. The reinforcing sheet 17 is fixed to rear surfaces of the connector connecting portion 16 and the flange portions 15 of the base film 13. It should be noted that electric insulating resin such as polyimide resin is used for the base film 13 and the coverlay layer 14.

Plated leads 12a are formed in two conductor patterns 11 located outermost in the width direction of the connector connecting portion 16 among the plurality of conductor patterns 11 exposed on the base film 13 of the connector connecting portion 16. Also, plated leads 12 are formed in the other conductor patterns 11. Here, the plated leads 12a correspond to exemplary first plated leads of the present invention, and the plated leads 12 correspond to exemplary second plated leads of the present invention.

The plated leads 12a are provided in a manner extending outward in the width direction of the base film 13 from central parts of the conductor patterns 11 in the direction of insertion into the connector 20, and reaching sides of the base film 13 in the width direction. Namely, the plated leads 12a are provided in a manner extending from the conductor patterns located outermost in the width direction of the connector connecting portion 16 to sides of the flexible printed wiring board 10 in the width direction.

The plated leads 12 are provided in a manner extending to a leading end of the base film 13 from leading ends of the conductor patterns 11 in the direction of insertion into the connector 20. Namely, the plated leads 12 are provided in a manner extending to a leading end of the flexible printed wiring board 10 from leading ends of the conductor patterns, which are not located outermost in the width direction of the connector connecting portion 16, in the direction in which the connector connecting portion 16 is inserted into the connector 20.

As a result, plating electrodes of a worksheet, to be described later, and the plurality of conductor patterns 11 can be electrically connected to each other, and multilayer electrolytic plating can be performed on the exposed portions of the plurality of conductor patterns 11 so as to ensure hardness and prevent oxidation.

Electrolytic plating is performed on a worksheet on which patterns for a plurality of flexible printed wiring boards 10 are arranged, and the plated leads 12 and 12a are electrically connected to plating electrodes of the worksheet. After the plating, each flexible printed wiring board 10 is punched into its outer shape from the worksheet using a die. In this case, to prevent the conductor patterns 11 from becoming deformed and changing in dimensions due to distortion occurring in the plated leads 12 and 12a, the widths of the plated leads 12 and 12a are set to be smaller than the width of the conductor patterns 11.

As described above, in the present embodiment, the plated leads 12a are provided in a manner extending outward in the width direction of the base film 13 from the insertion-direction central parts of the two conductor patterns 11 located outermost in the width direction among the plurality of conductor patterns 11 exposed in the connector connecting portion 16. Therefore, even when the connector connecting portion 16 is inserted obliquely into the connector 20, the plated leads 12a can be prevented from sliding in contact with connector terminals in the connector 20 obliquely across the connector terminals.

Moreover, in a stage where the plated leads 12 next to the plated leads 12a come into contact with the connector terminals in the connector 20, the direction in which the connector connecting portion 16 is inserted is corrected to a normal insertion direction. Therefore, the plated leads 12 as well can be prevented from sliding in contact with the connector terminals in the connector 20 obliquely across the connector terminals.

Thus, without bringing about an increase in the overall length of the flexible printed wiring board 10, and even in a case where the flexible printed wiring board 10 is a one-sided or double-sided one, the plated leads 12 and 12a can be prevented from peeling off due to repeated insertion and extraction of the connector connecting portion 16 into and from the connector 20. As a result, electrically poor connection, leakage, shorting, and so on caused by peel-off of the plated leads 12 and 12a can be prevented.

Figure 4:
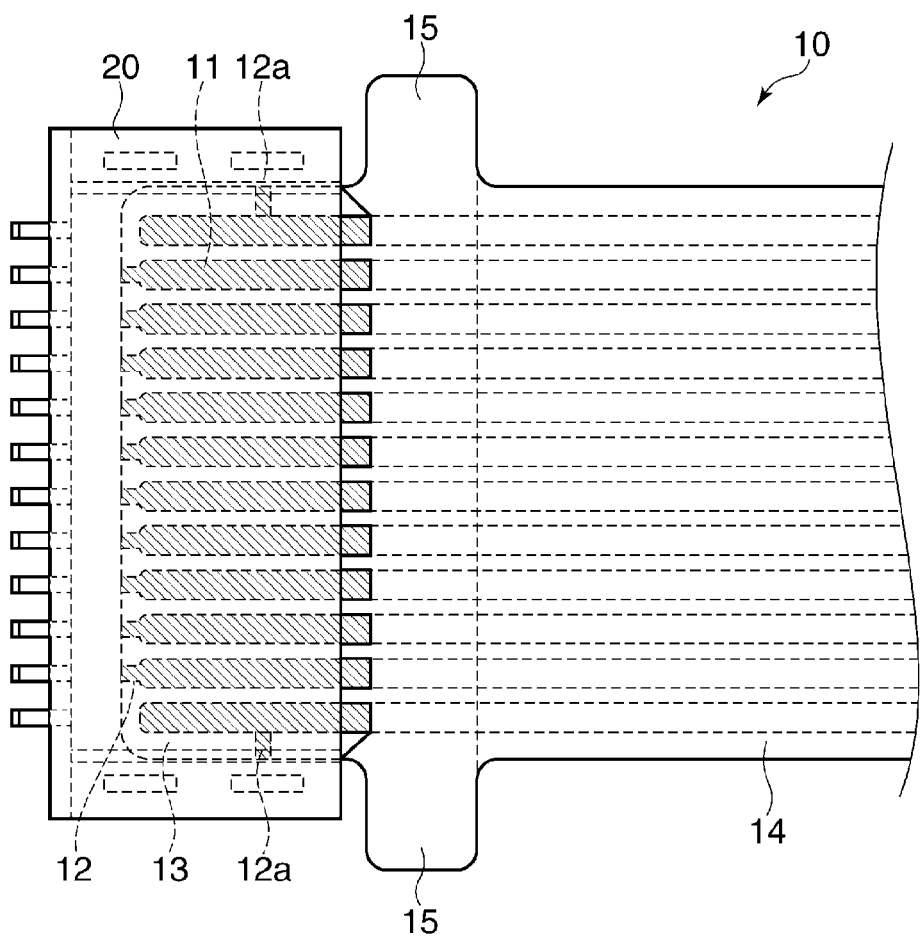
FIG. 4 is a plan view showing a state in which the connector connecting portion of the flexible printed wiring board is connected to the connector.

Moreover, in the present embodiment, in a state where the connector connecting portion 16 is connected to the connector 20, the plated leads 12a as well are disposed in the connector 20 and covered with a wall of the connector 20 as shown in FIG. 4. Thus, electric shorting, leakage, and so on caused by the plated leads 12a coming into contact with other conductors can be prevented.

Figure 5:
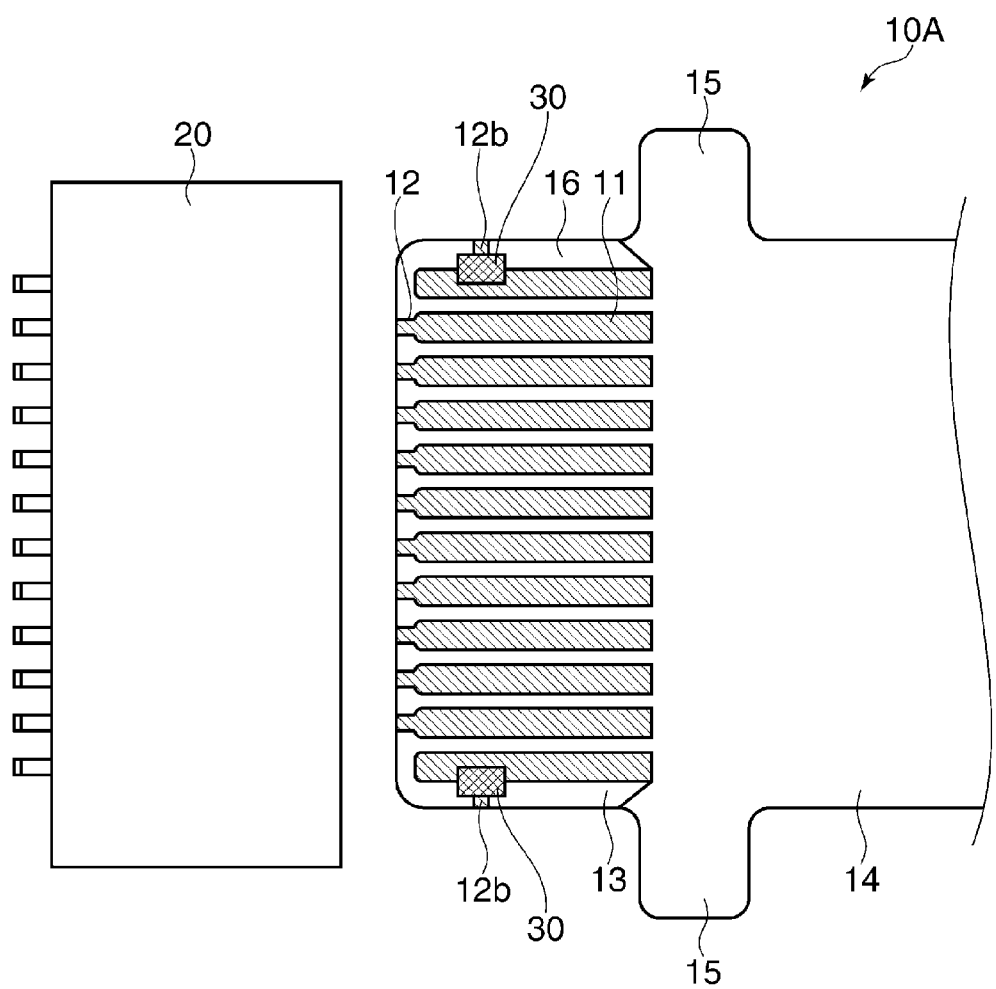
FIG. 5 is a plan view showing a state before the connector connecting portion of a flexible printed wiring board according to a second embodiment of the present invention is connected to the connector.

Referring next to FIG. 5, a description will be given of a flexible printed wiring board according to a second embodiment of the present invention. It should be noted that the components same as or corresponding to those of the first embodiment are designated by the same reference symbols, description of which, therefore, is omitted.

FIG. 5 is a plan view showing a state before the connector connecting portion 16 of the flexible printed wiring board 10A according to the second embodiment of the present invention is connected to the connector 20.

Referring to FIG. 5, punching shift marks 30 are marks that are provided so as to make it easier to identify a shift when the flexible printed wiring board 10A is punched from a worksheet into its outer shape. In the present embodiment, the punching shift marks 30 are disposed on respective outer sides of the two conductor patterns 11 located outermost in the width direction of the base film 13 among the plurality of conductor patterns 11 exposed on the base film 13 of the connector connecting portion 16. The interval between the punching shift marks 30 and sides of the base film 13 in the width direction are set to be near a processing limit.

In a case where the flexible printed wiring board 10A is punched from a worksheet at a position shifted to a larger extent from an estimated error, the punching shift marks 30 are cut, and hence the flexible printed wiring board 10A after punching is a defective.

In the present embodiment, with the help of the punching shift marks 30, plated leads 12b are provided in a manner extending outward from the punching shift marks 30 in the width direction of the base film 13.

As a result, the length of the plated leads 12b is reduced, and the width of base portions of the plated leads 12b is increased, resulting in an increase in the peeling strength of the plated leads 12b with respect to the base film 13. Moreover, the effects of distortion, which occurs in the plated leads 12b when the flexible printed wiring board 10A is punched from a worksheet into its outer shape using a die, on the conductor patterns 11 can be further reduced. Other arrangements and effects are identical with the corresponding ones of the first embodiment described above.

Figure 6:
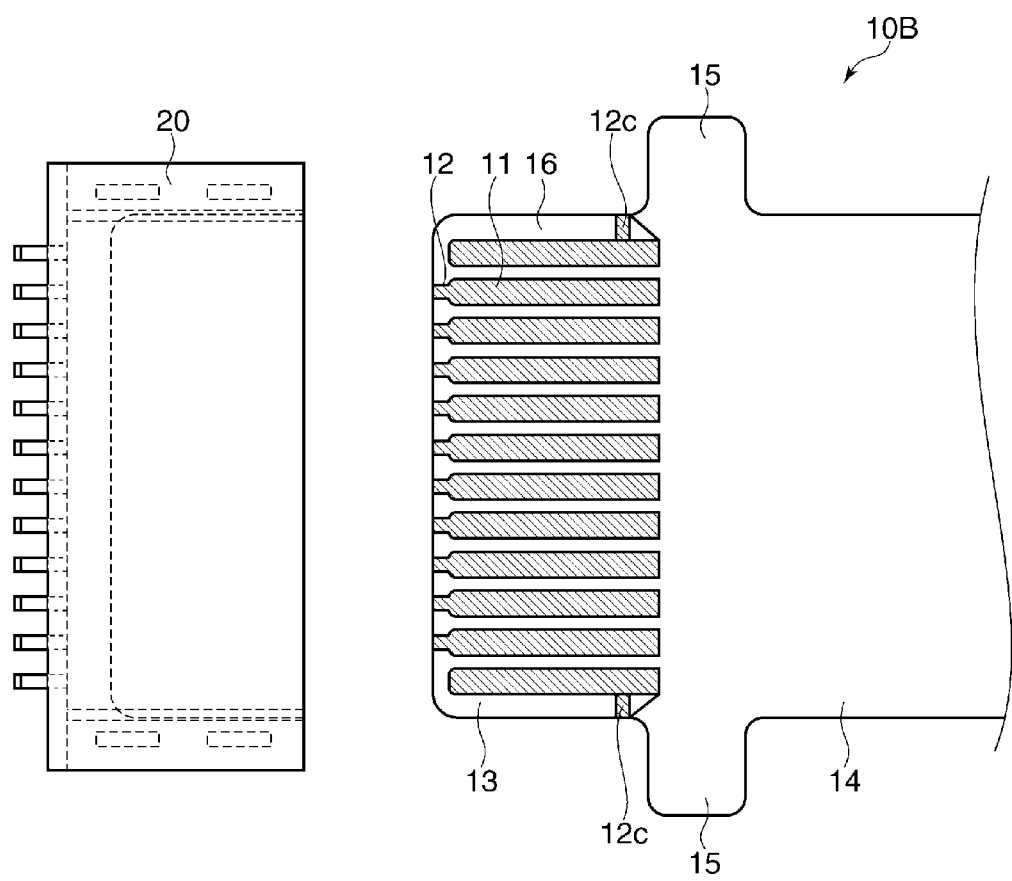
FIG. 6 is a plan view showing a state before the connector connecting portion of a flexible printed wiring board according to a third embodiment of the present invention is connected to the connector.
Figure 7:
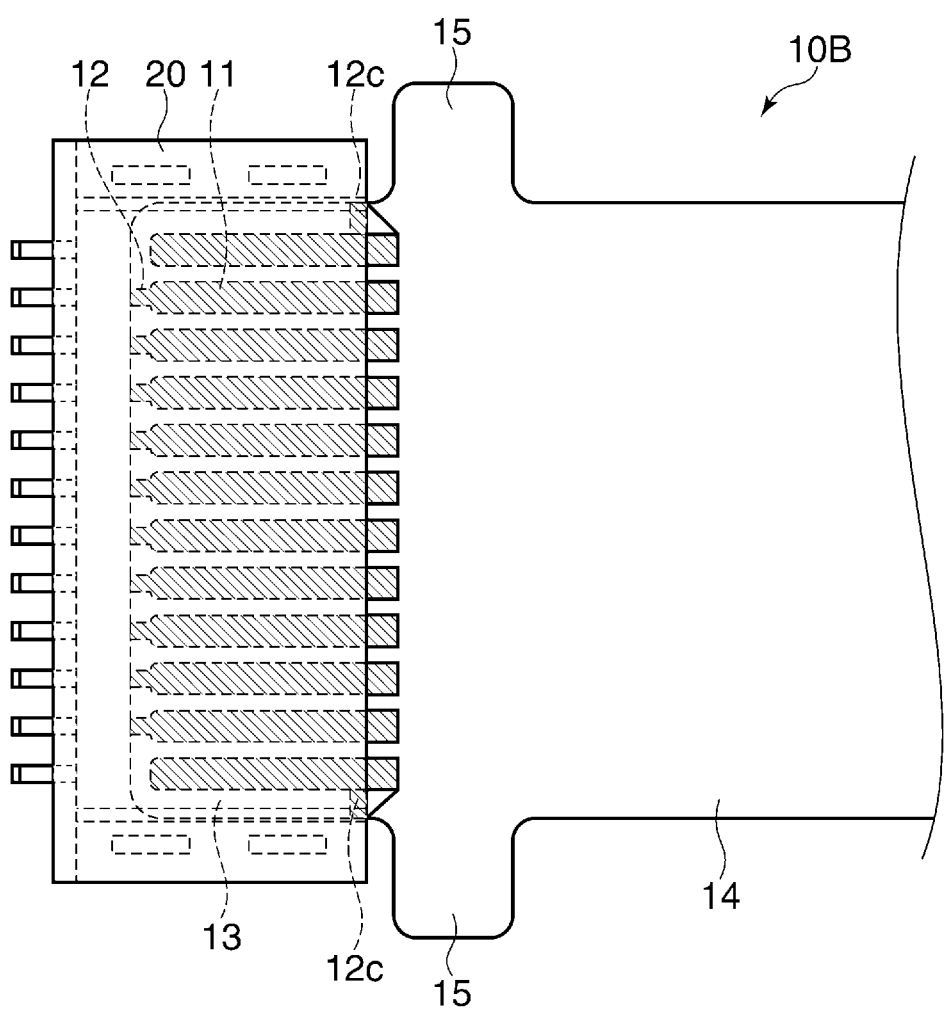
FIG. 7 is a plan view showing a state in which the connector connecting portion of the flexible printed wiring board appearing in FIG. 6 is connected to the connector.

Referring next to FIGS. 6 and 7, a description will be given of a flexible printed wiring board according to a third embodiment of the present invention. It should be noted that the components same as or corresponding to those of the first embodiment described above are designated by the same reference symbols, description of which, therefore, is omitted.

FIG. 6 is a plan view showing a state before the connector connecting portion 16 of the flexible printed wiring board 10B according to the third embodiment of the present invention is connected to the connector 20. FIG. 7 is a plan view showing a state in which the connector connecting portion 16 of the flexible printed wiring board 10B appearing in FIG. 6 is connected to the connector 20.

In the present embodiment, plated leads 12c are provided in a manner extending outward in the width direction of the base film 13 from flange portion 15—side positions of the two conductor patterns 11 located outermost in the width direction among the plurality of conductor patterns 11 exposed in the connector connecting portion 16.

In a state where the connector connecting portion 16 is connected to the connector 20, the plated leads 12c are disposed at positions substantially corresponding to an end face of the connector 20 on the side into which the connector connecting portion 16 is inserted as shown in FIG. 7.

Thus, in a case where the connector connecting portion 16 is not normally connected to the connector 20, the plated leads 12c extend beyond the end face of the connector 20, and hence whether or not the connector connecting portion 16 is normally connected to the connector 20 can be determined. Other arrangements and effects are identical with the corresponding ones of the first embodiment described above.

Figure 8:
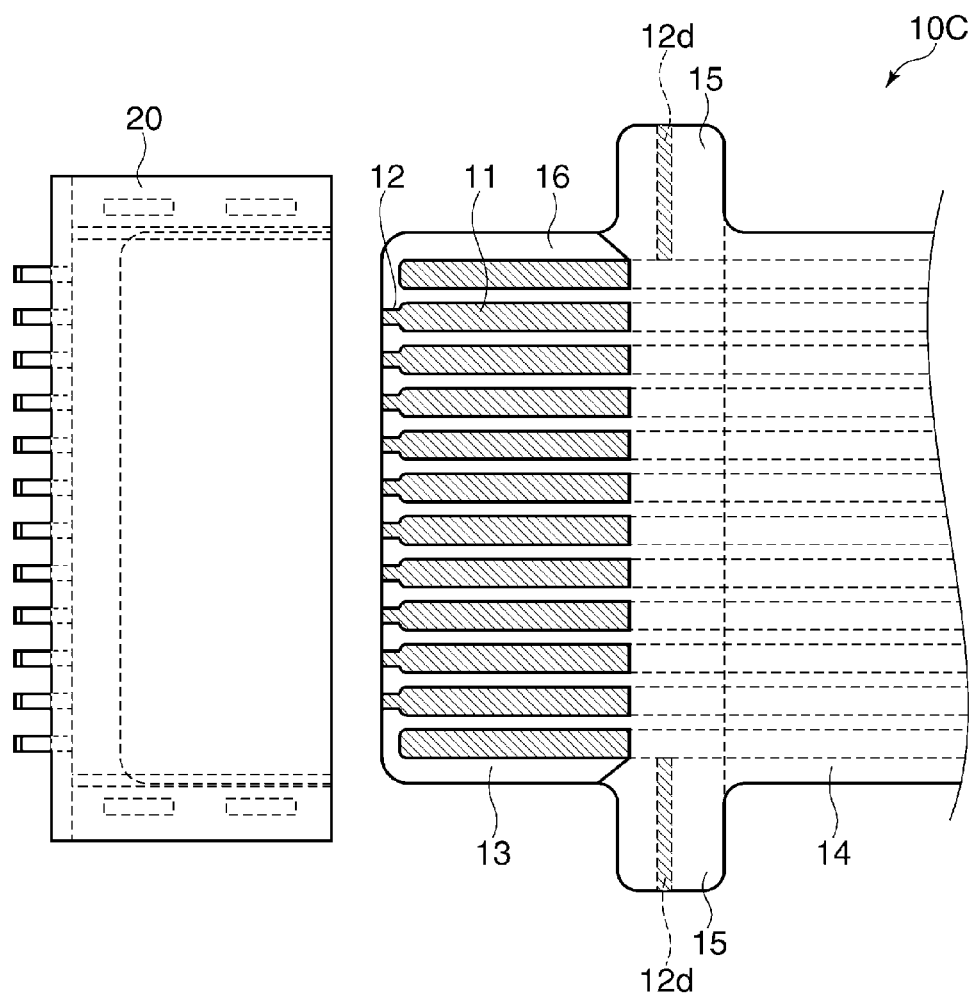
FIG. 8 is a plan view showing a state before the connector connecting portion of a flexible printed wiring board according to a fourth embodiment of the present invention is connected to the connector.

Referring next to FIG. 8, a description will be given of a flexible printed wiring board according to a fourth embodiment of the present invention. It should be noted that the components same as or corresponding to those of the first embodiment described above are designated by the same reference symbols, description of which, therefore, is omitted.

FIG. 8 is a plan view showing a state before the connector connecting portion 16 of the flexible printed wiring board 10C according to the fourth embodiment of the present invention is connected to the connector 20.

In the present embodiment, plated leads 12d are provided in a manner extending outward in the width direction of the base film 13 from flange portion 15—corresponding positions of the two conductor patterns 11 located outermost in the width direction of the base film 13 among the plurality of conductor patterns 11 and reaching leading end faces of the flange portions 15.

Moreover, because as described above, the flange portions 15 are covered with the coverlay layer 14, and the reinforcing sheet 17 is disposed on the opposite side of the coverlay layer 14, the flexible printed wiring board 10C never becomes deformed, and the positions of the plated leads 12d are fixed. As a result, even though the plated leads 12d are not covered with the connector 20, problems such as shorting caused by interference with other conductors can be avoided. Other arrangements and effects are identical with the corresponding ones of the first embodiment described above.

Figure 9:
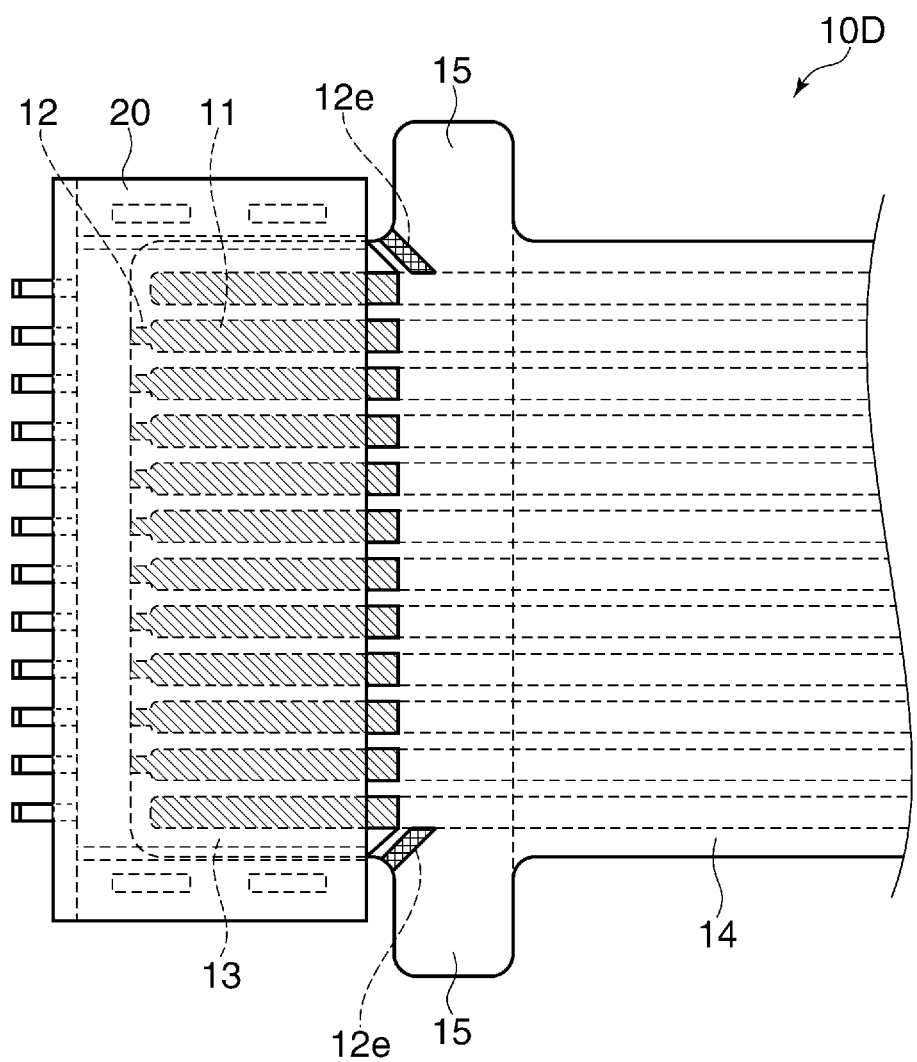
FIG. 9 is a plan view showing a state in which the connector connecting portion of a flexible printed wiring board according to a fifth embodiment of the present invention is connected to the connector.

Referring next to FIG. 9, a description will be given of a flexible printed wiring board according to a fifth embodiment of the present invention. It should be noted that the components same as or corresponding to those of the first embodiment described above are designated by the same reference symbols, description of which, therefore, is omitted.

FIG. 9 is a plan view showing a state in which the connector connecting portion 16 of the flexible printed wiring board 10D according to the fifth embodiment of the present invention is connected to the connector 20.

In the present embodiment, plated leads 12e are provided in a manner extending obliquely in the width direction of the base film 13 from flange portion 15 positions of the two conductor patterns 11 located outermost in the width direction of the base film 13 among the plurality of conductor patterns 11 and reaching sides which are boundaries between the connector connecting portion 16 and the flange portions 15.

In the present embodiment, because there is no installation space for other conductors between the flange portions 15 and the connector 20, it is unnecessary to worry about surrounding conductors, and problems such as shorting can be avoided. Other arrangements and effects are identical with the corresponding ones of the first embodiment described above.

Figure 10:
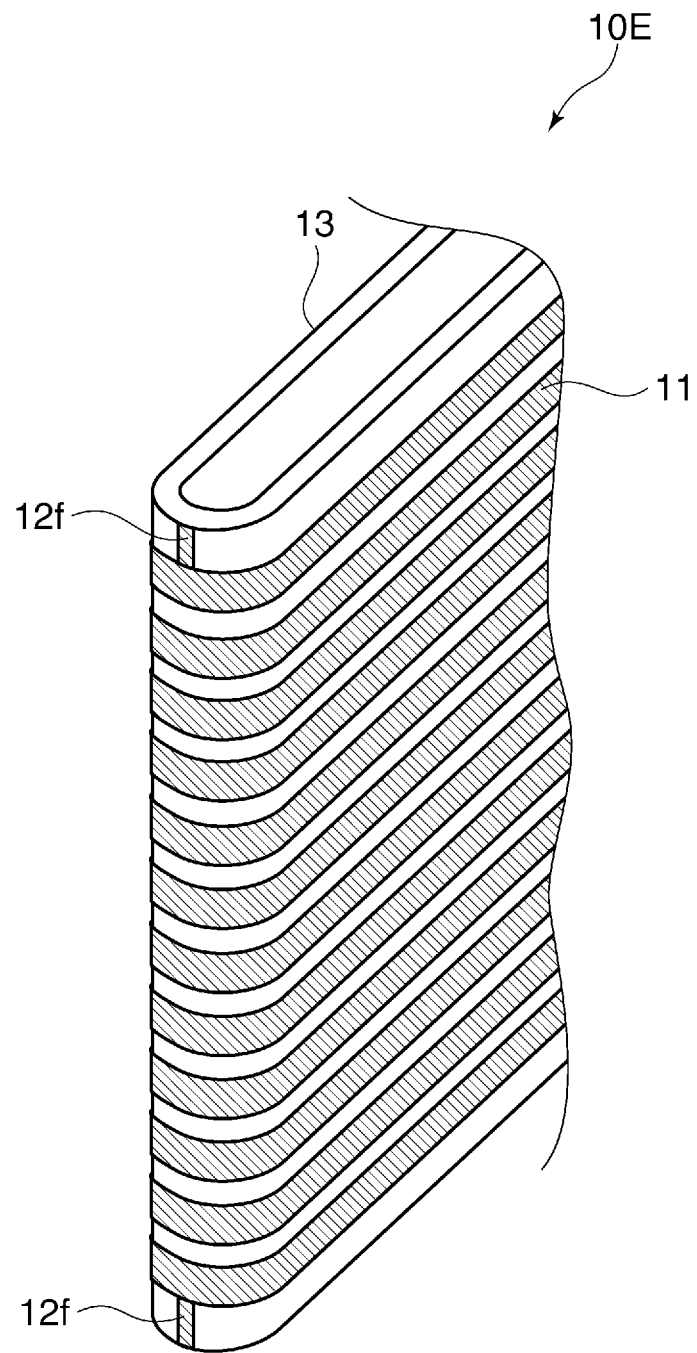
FIG. 10 is a perspective view showing a bent portion of a flexible printed wiring board according to a sixth embodiment of the present invention.
Figure 11:
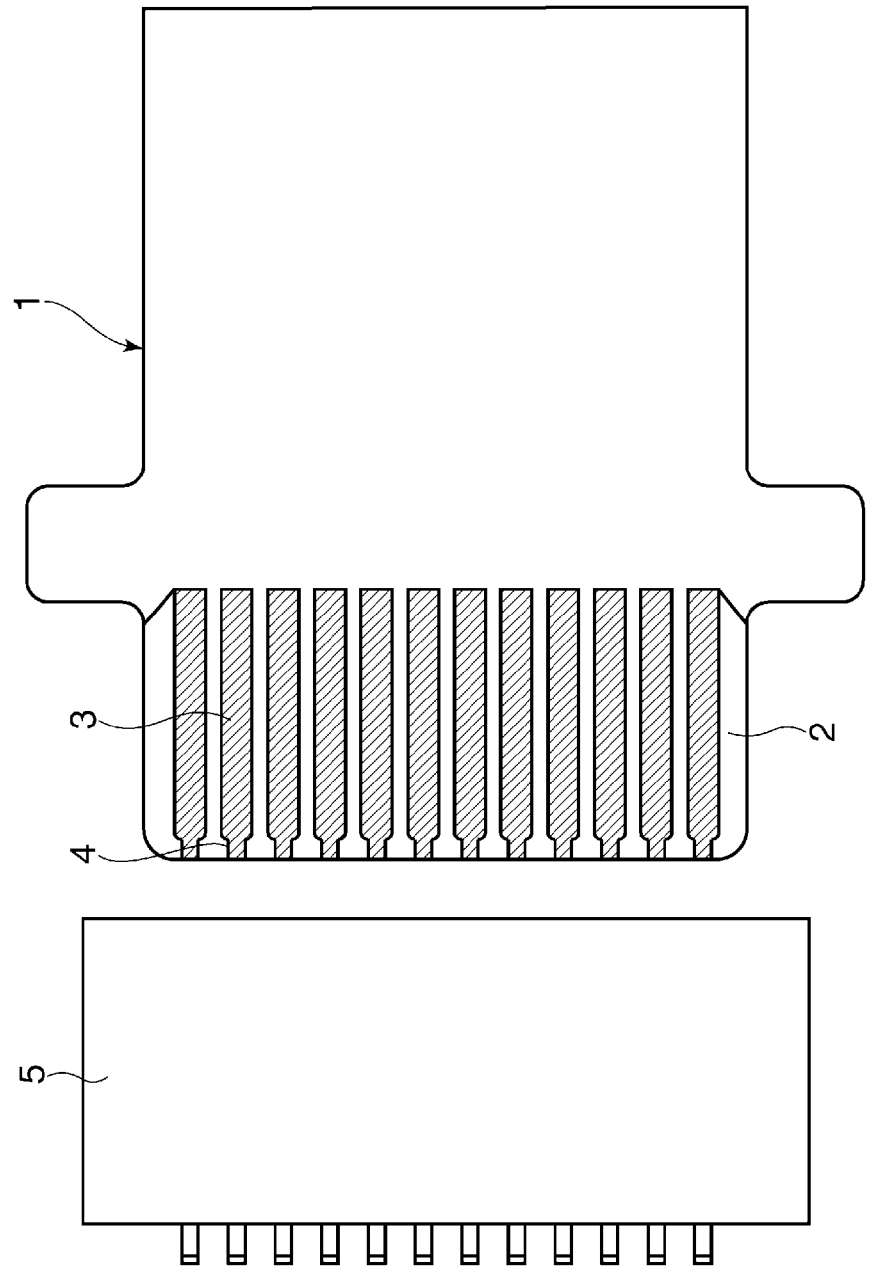
FIG. 11 is a plan view showing essential parts in a state before a connector connecting portion of a conventional flexible printed wiring board is connected to a connector.

Referring next to FIG. 10, a description will be given of a flexible printed wiring board according to a sixth embodiment of the present invention. It should be noted that the components same as or corresponding to those of the first embodiment described above are designated by the same reference symbols, description of which, therefore, is omitted.

FIG. 10 is a perspective view showing a bent portion of the flexible printed wiring board 10E according to the sixth embodiment of the present invention.

In the present embodiment, plated leads 12f are provided in a manner extending outward in the width direction of the base film 13 from the two conductor patterns 11 located outermost in the width direction of the base film 13 among the plurality of conductor patterns 11 and reaching sides of the base film 13 in the width direction.

As a result, the plated leads 12f double as bending indicators at the time of bending the flexible printed wiring board 10E and also have a high level of visibility, and hence, workability can be improved. Other arrangements and effects are identical with the corresponding ones of the first embodiment described above.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-121527 filed May 31, 2011, which is hereby incorporated by reference herein in its entirety.

What is claimed is:

1. A flexible printed wiring board which has a connector connecting portion electrically connected to connector terminals of a connector, and in which in the connector connecting portion, a plurality of conductor patterns are spaced in a width direction of the connector connecting portion, comprising:
   first plated leads provided in a manner extending from conductor patterns located outermost in the width direction of the connector connecting portion among the plurality of conductor patterns and reaching sides of the flexible printed wiring board in a width direction;
   second plated leads provided in a manner extending from leading ends of the other conductor patterns among the plurality of conductor patterns in a direction in which the connector connecting portion is inserted into the connector and reaching a leading end face of the flexible printed wiring board; and
   an electric insulating layer provided in a manner protecting the plurality of conductor patterns except the connector connecting portion,
   wherein the first plated leads are formed outside of the connector connecting portion, and protected by the electric insulating layer.

2. A flexible printed wiring board according to claim 1, wherein insertion-extraction flange portions projecting outward in the width direction of the connector connecting portion are formed on both sides near the connector connecting portion in the width direction, and the first plated leads are formed in the flange portions.

3. A flexible printed wiring board according to claim 1, wherein the conductor patterns which have the first plated leads do not have plated leads extending from leading ends of the conductor patterns in a direction in which the connector connecting portion is inserted into the connector and reaching a leading end face of the flexible printed wiring board.

4. A flexible printed wiring board according to claim 1, further comprising a reinforcing member provided on the connector connecting portion,
   wherein the plurality of conductor patterns are provided on a first side of the connector connecting portion, and
   the reinforcing member is provided on the second side of the connector connecting portion which is an opposed side of the first side.

5. A flexible printed wiring board according to claim 2, wherein the first plated leads are provided in a manner extending obliquely to boundaries between the connector connecting portion and the flange portions.

6. A flexible printed wiring board according to claim 3, further comprising a reinforcing member provided on the connector connecting portion,
   wherein the plurality of conductor patterns are provided on a first side of the connector connecting portion, and
   the reinforcing member is provided on the second side of the connector connecting portion which is an opposed side of the first side so as to be fixed to the flange portions.

* * * * *